(12) United States Patent
Chen et al.

(10) Patent No.: US 11,079,814 B2
(45) Date of Patent: Aug. 3, 2021

(54) MECHANISM FOR SECURING AN ADD-IN MODULE IN A COMPUTER DEVICE

(71) Applicant: QUANTA COMPUTER INC., Taoyuan (TW)

(72) Inventors: Chao-Jung Chen, Taoyuan (TW); Chih-Wei Lin, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 16/829,835

(22) Filed: Mar. 25, 2020

(65) Prior Publication Data

US 2021/0208643 A1    Jul. 8, 2021

Related U.S. Application Data

(60) Provisional application No. 62/956,939, filed on Jan. 3, 2020.

(51) Int. Cl.
*G06F 1/18* (2006.01)
*H05K 7/14* (2006.01)
*H05K 7/18* (2006.01)

(52) U.S. Cl.
CPC ............ *G06F 1/186* (2013.01); *H05K 7/1405* (2013.01); *H05K 7/183* (2013.01)

(58) Field of Classification Search
CPC .......... G06F 1/183; G06F 1/186; G06F 1/187; H05K 7/1409; H05K 7/1417; H05K 7/1405; H05K 7/1404; H05K 7/183
See application file for complete search history.

(56) References Cited

U.S. PATENT DOCUMENTS

| | | | |
|---|---|---|---|
| 5,364,284 A * | 11/1994 | Tohyama | H05K 7/1023 439/266 |
| 9,134,772 B2 * | 9/2015 | Zhang | F16C 29/00 |
| 2017/0042055 A1 * | 2/2017 | Chen | G06F 1/183 |

* cited by examiner

*Primary Examiner* — James Wu
(74) *Attorney, Agent, or Firm* — Nixon Peabody LLP

(57) ABSTRACT

An apparatus and method for engaging a mounting panel of a computer device includes a bracket, as well as a lever and slider mechanism connected to the bracket. The lever and slider mechanism includes a base, a wedge slider, a lever, a geared bar, and a biasing element. The base is connected to the bracket. The wedge slider is connected to the bracket and disposed immediately below the base. Rotating the lever from a first position to a second position causes a gear to engage the geared bar, causing the geared bar to move vertically. The rotating allows movement along the contact between an angled end of the geared bar and a wedged end protrusion of the wedge slider such that the biasing element pushes the wedge slider away from the bracket and allows the wedge slider to engage an opening in a mounting panel.

17 Claims, 7 Drawing Sheets

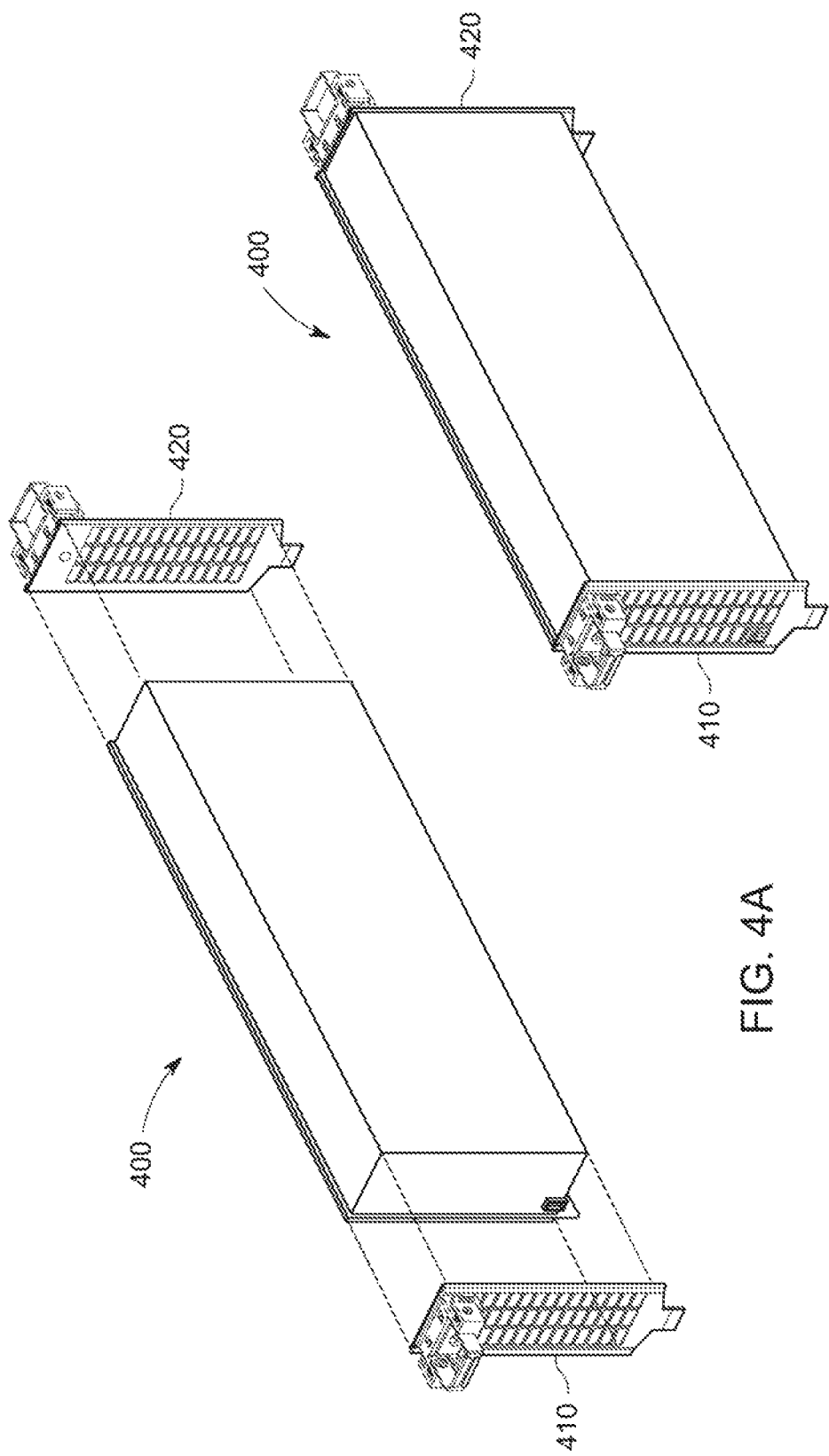

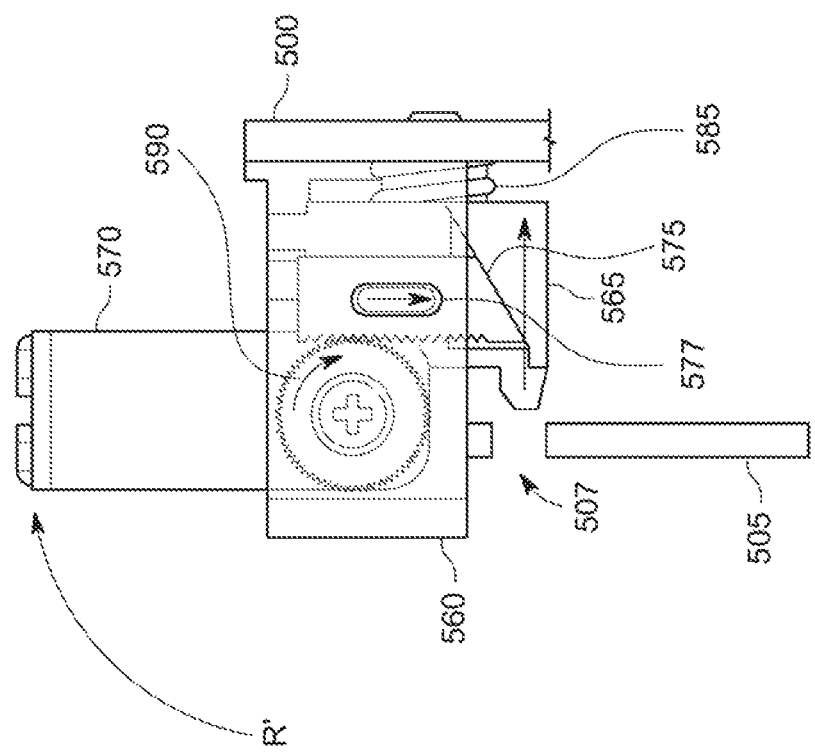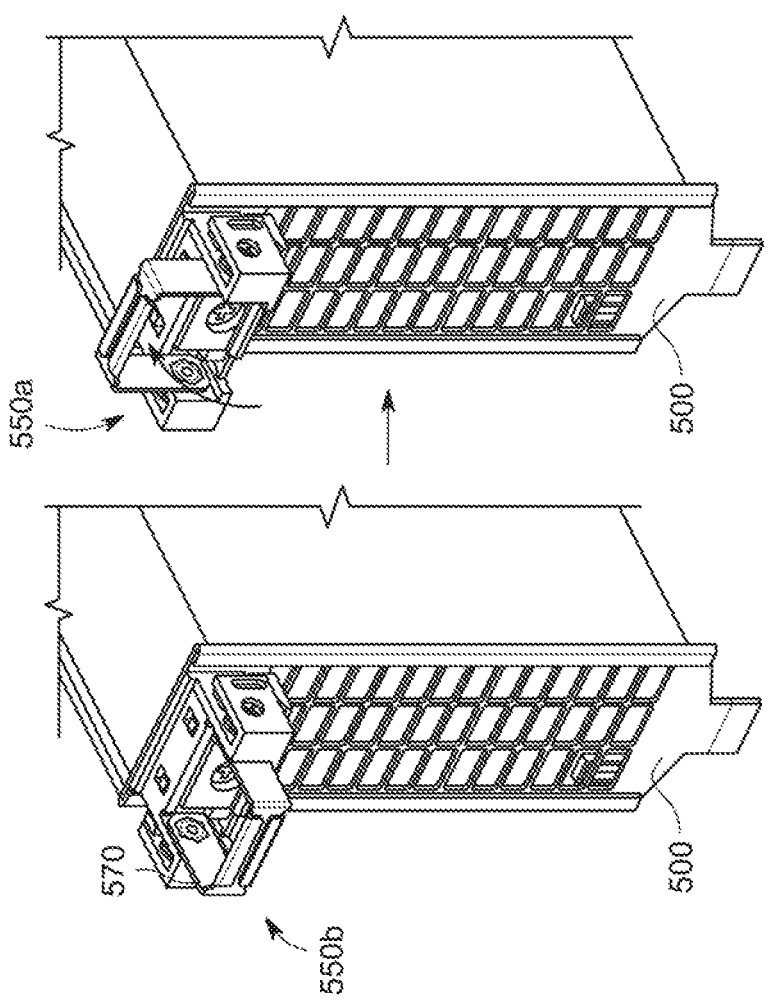
FIG. 6A  FIG. 6B  FIG. 6C

MECHANISM FOR SECURING AN ADD-IN MODULE IN A COMPUTER DEVICE

CROSS-REFERENCE TO RELATED APPLICATION

This application claims priority under 35 U.S.C. § 119 to U.S. Provisional Application No. 62/956,939, entitled "TOOL-LESS MECHANISM DESIGN ON PCIE IO BRACKET", filed on Jan. 3, 2020. The contents of that application are hereby incorporated by reference in their entirety.

FIELD OF THE INVENTION

The present invention relates to securing add-in modules. More specifically, the present invention relates to mechanisms for securing and releasing add-in modules in a computer device.

BACKGROUND

Typically, conventional add-in modules for computer device, such as peripheral component interface ("PCI") or PCI express ("PCIe") add-in modules, include input/output (IO) brackets at the ends of the module. The IO brackets are secured to the add-in module. The IO bracket typically has a lateral mounting extension that is perpendicular to the IO bracket. The lateral mounting extension is then formed or machined to have one or more holes for receiving a screw to fix the IO bracket(s) within the chassis of the computer device. By fixing the IO bracket(s) to the chassis with screws, the add-in module is also effectively secured since the IO brackets are secured to the add-in module. However, conventional add-in modules and securing mechanisms for computer devices do not allow the add-in module to be easily secured or removed.

Accordingly, there is a need for increasing the efficiency in the building and servicing of add-in modules for computer devices.

SUMMARY

According to one embodiment, an apparatus for engaging a mounting panel of a computer device includes a bracket, as well as a lever and slider mechanism connected to the bracket. The lever and slider mechanism includes a base connected to the bracket and a wedge slider connected to the bracket and disposed immediately below the base. The wedge slider has a wedged end protrusion. The lever and slider mechanism also includes a lever connected to the base and coupled to a gear. The lever is rotatable from a first position to a second position and from the second position to the first position. The lever and slider mechanism also includes a geared bar connected to the base and operably coupled to the gear. The geared bar has an angled end abutting and in substantial contact with the wedged end protrusion. The lever and slider mechanism also includes a biasing element disposed between the wedge slider and an outer surface of the bracket. The biasing element applies a force on the wedge slider in a direction away from the outer surface of the bracket. Rotating the lever from the first position to the second position causes the gear to engage the geared bar causing the geared bar to move vertically. Moving the geared bar vertically allows movement along the contact between the angled end of the geared bar and the wedged end protrusion of the wedge slider such that the biasing element pushes the wedge slider away from the bracket and allows the wedge slider to engage an opening in a mounting panel.

A further aspect of the embodiment includes rotating the lever from the second position to the first position which causes the gear to engage the geared bar, thereby causing the geared bar to move vertically in an opposite direction. The geared bar moving in an opposite direction allows movement in an opposite direction along the contact between the angled end of the geared bar and the wedged end protrusion of the wedge slider. The wedge slider provides a counter force to the biasing element that moves the wedge slider closer to the bracket and allows the wedge slider to disengage from the opening in the mounting panel. Another aspect of the embodiment includes the bracket being an elongated bracket. Still another aspect includes the bracket having a plurality of openings. Yet another aspect includes a step screw connecting the wedge slider to the bracket. Yet another aspect includes the biasing element being a spring. Yet another aspect includes the step screw being partially inserted through the center of the spring such that the spring surrounds a length of the step screw. Yet another aspect includes the geared bar having a protrusion and the base including at least one slot. The protrusion from the geared bar is disposed in the slot such that the slot defines a pathway of movement for the geared bar.

According to another embodiment, an add-in module for a computer device includes a housing having an outer shell defining at least two open opposing sides. The housing can hold a plurality of peripheral components. The add-in module also includes two input/output brackets each disposed over one of the opposing open sides. At least one of the input/output brackets has a lever and slider mechanism, including a base connected to the at least one input/output bracket and a wedge slider connected to the at least one input/output bracket. The wedge slider is disposed immediately below the base and has a wedged end protrusion. The lever and slider mechanism also includes a lever connected to the base and coupled to a gear. The lever is rotatable from a first position to a second position and from the second position to the first position. The lever and slider mechanism also includes a geared bar connected to the base and operably coupled to the gear. The geared bar has an angled end abutting and in substantial contact with the wedged end protrusion. The lever and slider mechanism also includes a spring disposed between the wedge slider and an outer surface of the input/output bracket. The spring biases the wedge slider away from the outer surface of the input/output bracket. Rotating the lever from the first position to the second position causes the gear to engage the geared bar causing the geared bar to move vertically. The geared bar moving vertically allows movement along the contact between the angled end of the geared bar and the wedged end protrusion of the wedge slider. The spring expands, thereby biasing the wedge slider away from the bracket and allowing the wedge slider to engage an opening in a mounting panel.

A further aspect of the embodiment includes rotating the lever from the second position to the first position, which causes the gear to engage the geared bar, thereby causing the geared bar to move vertically in an opposite direction. The geared bar moving vertically in the opposite direction allows movement in an opposite direction along the contact between the angled end of the geared bar and the wedged end protrusion of the wedge slider. The wedge slider provides a counter force compressing the spring and moving the wedge slider closer to the bracket to allow the wedge slider to disengage from the opening in the mounting panel. Another aspect of the embodiment includes the two input/output brackets each having a plurality of openings. Still another aspect includes the at least one of the input/output brackets substantially covering one of the open sides. Yet another aspect includes the add-in module being a peripheral component interconnect express module. Yet another aspect includes the two input/input brackets being peripheral component interconnect express input/output brackets. Yet another aspect includes a step screw connecting the wedge slider to the at least one input/output bracket. Yet another aspect includes the step screw being partially inserted through the center of the spring such that the spring surrounds a length of the step screw. Yet another aspect includes the geared bar having a protrusion and the base including at least one slot. The protrusion from the geared bar is disposed in the slot such that the slot defines a pathway of movement for the geared bar.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure will be better understood from the following description of embodiments together with reference to the accompanying drawings.

FIGS. 4A and 4B are exploded and assembled perspective views of a PCIe IO bracket with a lever and slider mechanism fixed to an add-in module, according to some implementations of the present disclosure.

FIGS. 6A and 6B are perspective views of a lever and slider mechanism for a PCIe IO bracket moving from an engaged to a disengaged position, according to some in of the present disclosure.

FIG. 6C is a side view of the lever and slider mechanism in FIG. 6B in the disengaged position, according to some implementations of the present disclosure.

Figure 1:
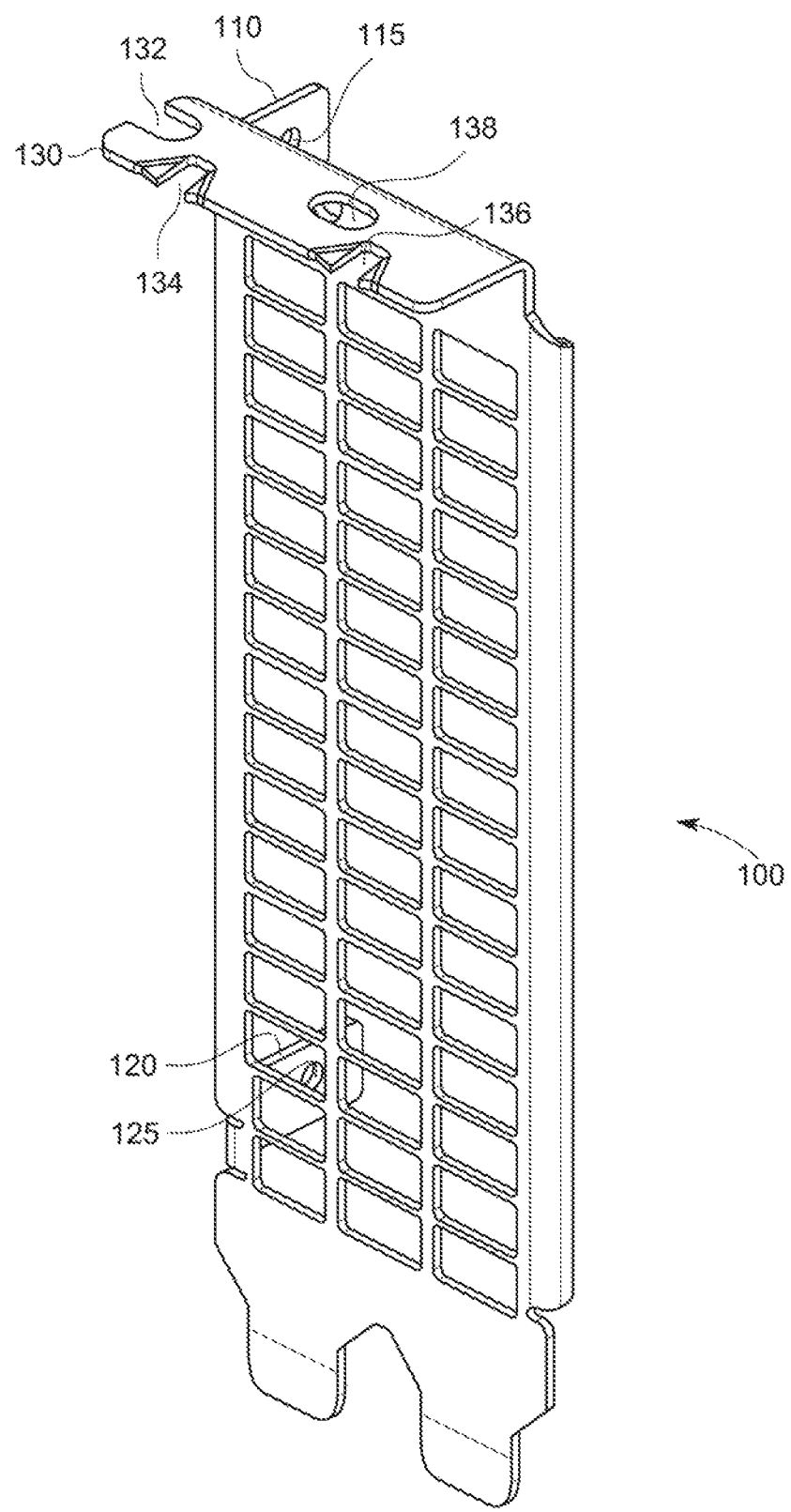
FIG. 1 is a perspective view of an exemplary conventional peripheral component interconnect express (PCIe) module input/output (IO) bracket.

The present disclosure is susceptible to various modifications and alternative forms. Some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION

The various embodiments are described with reference to the attached figures, where like reference numerals are used throughout the figures to designate similar or equivalent elements. The figures are not drawn to scale, and they are provided merely to illustrate the instant invention. It should be understood that numerous specific details, relationships, and methods are set forth to provide a full understanding. One having ordinary skill in the relevant art, however, will readily recognize that the various embodiments can be practiced without one or more of the specific details, or with other methods. In other instances, well-known structures or operations are not shown in detail to avoid obscuring certain aspects of the various embodiments. The various embodiments are not limited by the illustrated ordering of acts or events, as some acts may occur in different orders and/or concurrently with other acts or events. Furthermore, not all illustrated acts or events are required to implement a methodology in accordance with the present invention.

Elements and limitations that are disclosed, for example, in the Abstract, Summary, and Detailed Description sections, but not explicitly set forth in the claims, should not be incorporated into the claims, singly, or collectively, by implication, inference, or otherwise. For purposes of the present detailed description, unless specifically disclaimed, the singular includes the plural and vice versa. The word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

With regards to the present disclosure, the terms "computing device" or "computing system" or "computer system" refer to any electronically-powered or battery-powered equipment that has hardware, software, and/or firmware components, where the software and/or firmware components can be configured for operating features on the device. The term "operating environment" can refer to any operating system or environment that functions to allow software to run on a computer system.

It would be desirable to increase the efficiency of manufacturing and servicing of add-in modules for a computing device, such as peripheral component interconnect ("PCI"), PCI express ("PCIe"), and others, by minimizing the need for tools, such as a screwdriver, to assist with securing and removing the add-in module(s). In some aspects of the present disclosure, a mechanism is described that is connected to an input/output ("IO") bracket of an add-in module to allow the add-in module to engage and disengage from a mounting panel secured within a chassis of a computer device. The described mechanism does so without the need for screws, tools, or other fastening systems that are not otherwise directly a part of or directly an extension of the IO bracket or the add-in module.

FIG. 1 is a perspective view of an exemplary peripheral component interconnect express (PCIe) module input/output (IO) bracket. The illustrated IO bracket 100 is secured to an add-in module, such that PCIe add-in module side extensions 110, 120 are integral with the bracket. The side extensions include extension holes 115, 125 to allow a conventional screw or similar fastener to fix the IO bracket 100 to an add-in module (not shown). The exemplary conventional IO bracket 100 further includes a top extension 130 that also includes several top extension holes 132, 134, 136, 138, one or all of which may have a conventional screw or similar fastener extending through the respective holes to secure the IO bracket 100 to a mounting panel within the chassis of a computer device.

Figure 2:
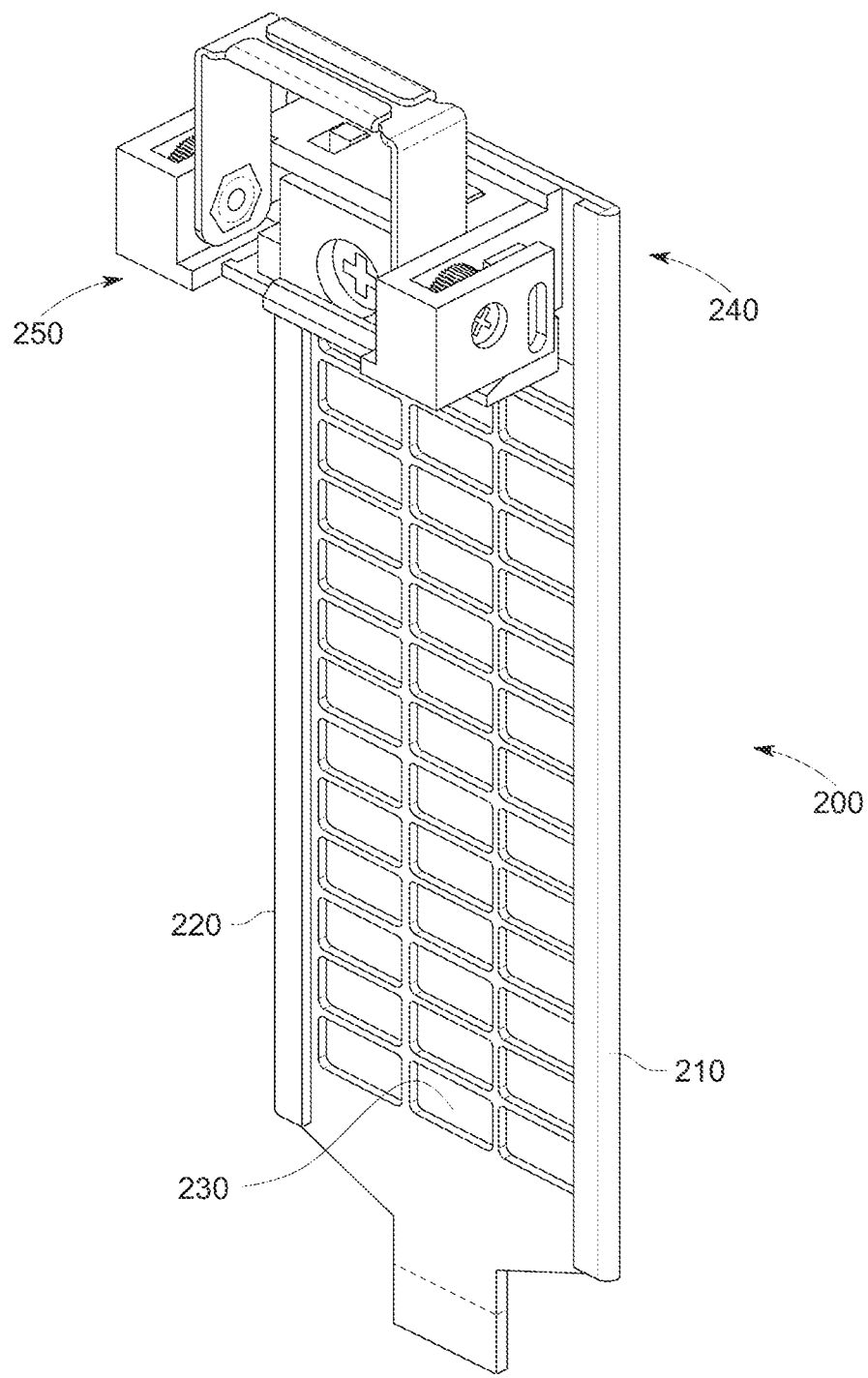
FIG. 2 is a perspective view of a PCIe add-in module IO bracket with a lever and slider mechanism for securing and removing an add-in module, according to some implementations of the present disclosure.
Figure 5C:
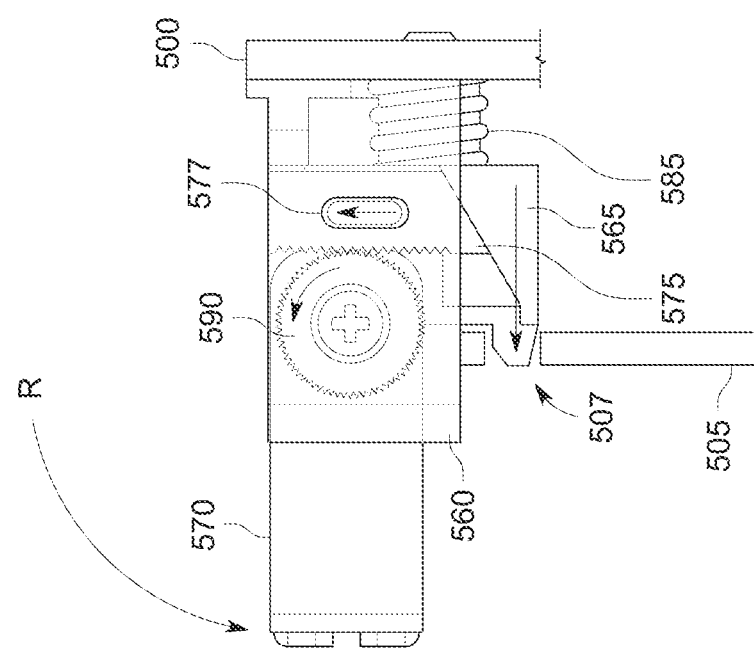
FIG. 5C is a side view of the lever and slider mechanism FIG. 5B in the engaged position, according to some implementations of the present disclosure.

Turning now to FIG. 2, a perspective view is provided of an exemplary add-in module IO bracket, such as a PCI or PCIe IO add-in module bracket, including a lever and slider mechanism for securing and removing an add-in module to a mounting panel. An elongated IO bracket 200 includes two integral side flanges 210, 220 and a plurality of openings 230. The top end 240 of the elongated bracket 200 includes a lever and slider mechanism 250 for engaging and disengaging from a mounting panel, such as the one depicted in FIGS. 5C and 6C. The lever and slide mechanism 250 is secured to the bracket 200 at the top end 240 and engages with the mounting panel without the need for any conventional fasteners, such as screw(s), or hand tools, such as a screw driver. The exemplary lever and slide mechanism 250 is described in more detail with respect to FIGS. 3 to 6C.

Figures 3A, 3B:
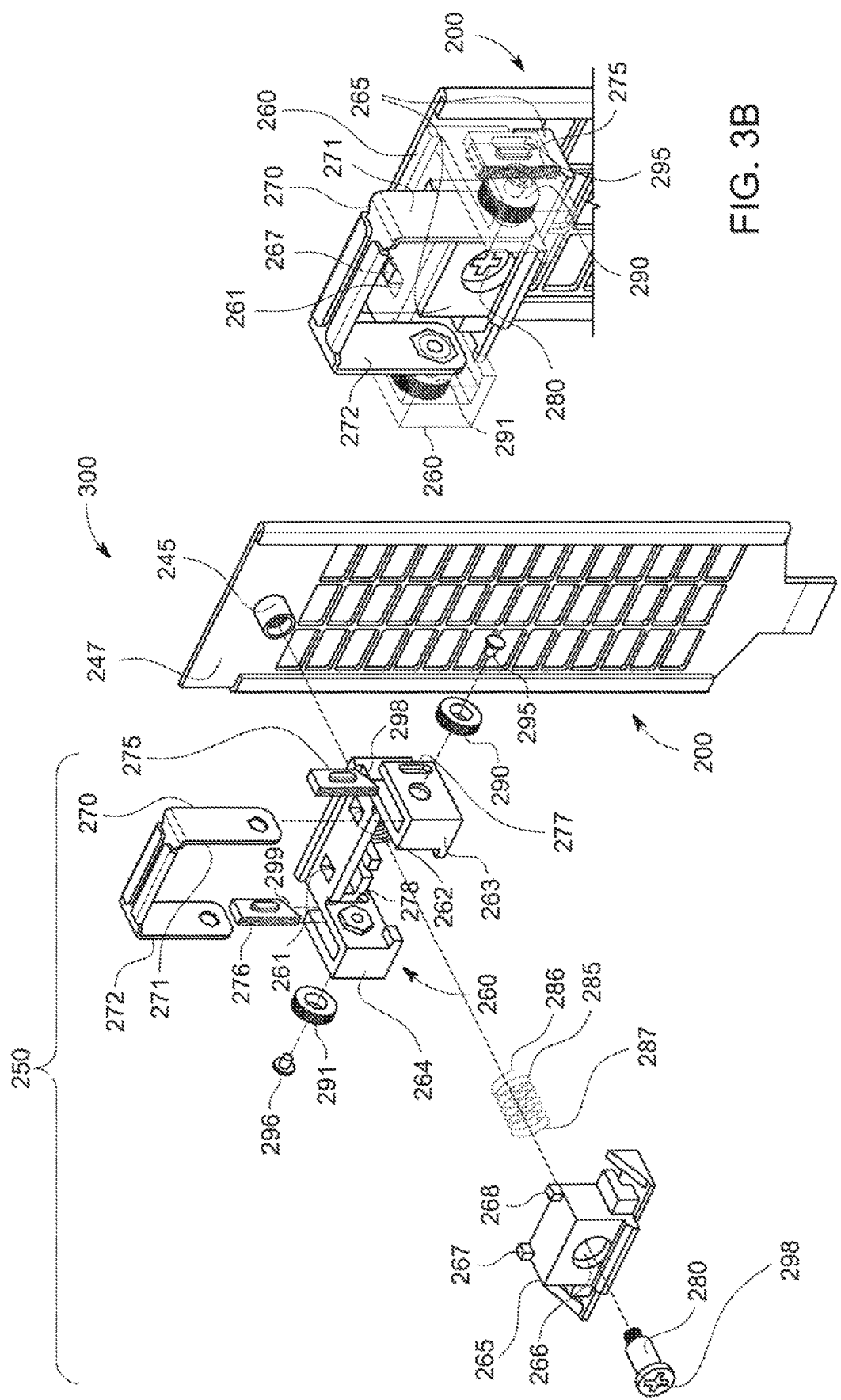
FIG. 3A is an exploded view of the PCIe add-in module IO bracket with the lever and slider mechanism illustrated in FIG. 2.
FIG. 3B is a perspective view of the lever and slider mechanism illustrated in FIGS. 2 and 3A.

Referring now to FIG. 3A, an exploded view is provided of a PCIe add-in module IO bracket with the lever and slider mechanism depicted in FIG. 2. The exemplary add-in module IO bracket 300 has several components. The lever and slide mechanism 250 can include a base 260, wedge slider 265, handle lever 270, geared bars 275, 276, step screw 280, spring 285, gears 290, 291, and gear screws 295, 296, which are all secured directly or indirectly to the IO bracket 200. The base 260 may further be fixed directly to add-in IO bracket 200. For example, the base 260 may be mechanically connected, welded, or integral with the IO bracket 200. In some implementations, the base 260 is fastened to the add-in IO bracket 200 by one or more screws extending through the opposite side of the add-in IO bracket 200 that thread into the backend of the base 260 or that thread into a nut or similar fastening element to allow the base to be fixed to the add-in IO bracket.

Referring also to FIG. 3B, a perspective view of the assembled lever and slider mechanism 250 is shown that is depicted in FIGS. 2 and 3A, with the base 260 depicted with transparent lines. The wedge slider 265 is connected to the top end 240 (in FIG. 2) of the add-in IO bracket 200 using the step screw 280, which penetrates a wedge slider aperture 266 (in FIG. 3A) that extends through the wedge slider 265. The step screw 280 threads into a threaded receiving sleeve 245 (in FIG. 3A) that is secured to the top end 240 of the add-in IO bracket 200. The step screw 280 could also otherwise be fastened to the add-in IO bracket, including for example, by threading directly into the add-in IO bracket or through some other mechanical or bonded connection. The spring 285 (in FIG. 3A) is disposed around the longitudinal axis of the step screw 280 and also penetrates a portion of the wedge slider aperture 266. A first end 286 (in FIG. 3A) of spring 285 is constrained by the portion of bracket surface 247 immediately around threaded receiving sleeve 245 (in FIG. 3A) and a second end is constrained by a flange or other intermediate protrusion into the wedge slider aperture 266 near where the top end of step screw 280 is finally seated for the assembled add-in IO bracket. The step screw 280 effectively connects the wedge slider 265 to the IO bracket 200 in a manner where the wedge slider 265 can translate along the longitudinal axis of the step screw 280. The spring 285 pushes or applies a relatively constant biasing force against the wedge slider 265 in a direction along the longitudinal axis of the step screw 280 and away from bracket surface 247 (in FIG. 3A). The biasing force of the spring 285 spaces the wedge slider from the bracket surface 247.

The wedge slider 265 includes one or more pillar-like protrusions 267, 268 (both in FIG. 3A) extending upwardly from the top of the wedge slider 265. When the lever and slider mechanism 250 (in FIG. 2) is assembled, the base 260 is positioned on the top of the wedge slider 265 with pillar-like protrusions 267, 268 of the slider each extending through respective first and receiving holes 261, 262 (in FIG. 3A) machined or otherwise formed in the base 260. The first and second receiving holes 261, 262 also allow the wedge slider 265 to slide perpendicularly to and away from bracket surface 247 and can further minimize movement of the wedge slider 265 parallel to bracket surface 247.

The base 260 has several components connected thereto including lever 270, geared bars 275, 276, gears 290, 291, and gear screws 295, 296. The lever 270 may be in the form of a handle that has two arms 271, 272 connected to base 260 using respective gear screws 295, 296, or similar mechanical connecting device. The handle arms 271, 272 of the lever 270 may be mechanically coupled to gears 290, 291, respectively, as well as, respective base arms 263, 264 (both in FIG. 3A) of the base 260. For example, a first axle may be connected to or integral with a first gear screw 295 that extends through a first portion of a first base arm 263 through the center of a first gear 290, and then through a second portion of first base arm 263 before being connected to handle arm 271. Similarly, a second axle may be connected to or integral with a second gear screw 296 that extends through a first portion of a second base arm 264 through the center of a second gear 291, and then through a second portion the second base arm 264 before being connected to handle arm 272. The exemplary configuration of the lever 270 is operable to rotate the first gear 290 and the second gear 291 when the lever 270 is rotated about the axles extending through the first and second base arms 263, 264.

The base 260 further has geared bars 275, 276 disposed on opposite sides of the base that, in an assembled configuration, are constrained by base arms 263, 264. The geared bars 275, 276 include gear teeth on at least one side of the respective bars that engage with at least one of gears 290, 291 when the assembled lever and slider mechanism 250 is operated. The geared bars 275, 276 each include one or more elongated protrusions that slide within respective slots 277, 278 of the base arms 263, 264 to guide the geared bars 275, 276 in an up and down or left to right direction when the gears 290, 291 rotate and act on the gear teeth. The bottom of each geared bar 275, 276 is angled such that each geared bar has a trapezoidal shape. The angled side 298, 299 of each geared bar 275, 276 engages with a corresponding angled portion of the wedge slider 265. It is contemplated that each base arm includes one or more slots (e.g., slots 277, 278) for receiving the elongated protrusions of the geared bars 275, 276.

In certain exemplary aspects, a gear 290 rotates in response to actuation of the lever 270. The rotation of gear 290 engages the gear teeth of geared bar 275, causing geared bar 275 to move in an up or down direction constrained by one or more slots in base 260, such as slot 277 in base arm 263. Protrusions from geared bar 275 disposed within the one or more slots, machined or formed in base 260, constrain the movement of geared bar 275 along a finite, defined pathway. The angled bottom side 298 of geared bar 275 engages with a corresponding angled portion of wedge slider 265 during movement of the geared bar 275 causing, the wedge slider 265 to translate perpendicularly away or toward bracket surface 247. Similarly, a second gear 291 may also rotate in response to actuation of the lever 270. The rotation of gear 291 engages the gear teeth of geared bar 276 causing geared bar 276 to move in an up or down direction constrained by one or more slots in base 260, such as a slot (not shown) in base arm 264. Protrusions from geared bar 276 disposed within the one or more slots, machined or formed in base 260, constrain the movement of geared bar 276 along a finite, defined pathway. The angled bottom side 299 of geared bar 276 then engages with a corresponding angled portion of wedge slider 265 during movement of geared bar 276 causing the wedge slider 265 to translate perpendicularly away or toward bracket surface 247. The rotations of the gears are desirably coordinated to allow for a smooth translations of wedge slider 265. The spring 285 is simultaneously compressing as the wedge slider 265 moves toward the bracket surface 247, or expanding as the wedge slider 265 moves away from the bracket surface 247.

Turning now to FIGS. 4A and 4B, exploded and assembled perspective views of an exemplary PCIe IO bracket with a lever and slider mechanism connected to an IO add-in module 400 are illustrated. The exemplary add-in module 400 includes two IO brackets 410, 420, such as the IO bracket illustrated in FIG. 2, on opposite ends of the add-in module 400. While a PCIe add-in module with PCIe IO brackets is illustrated in FIGS. 4A and 4B, it is contemplated that the lever and slider mechanism can have other applications within a computer device, such as with other add-in modules.

Figure 5B:
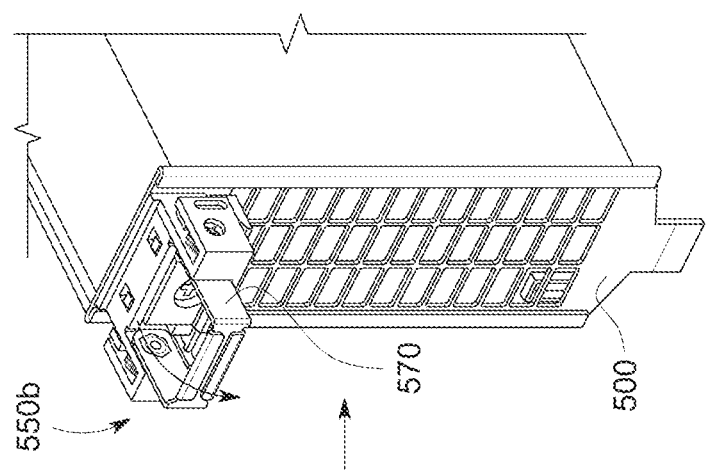
FIGS. 5A and 5B are perspective views of a lever and slider mechanism for a PCIe IO bracket moving from a disengaged to an engaged position, according to some implementations of the present disclosure.
Figure 5A:
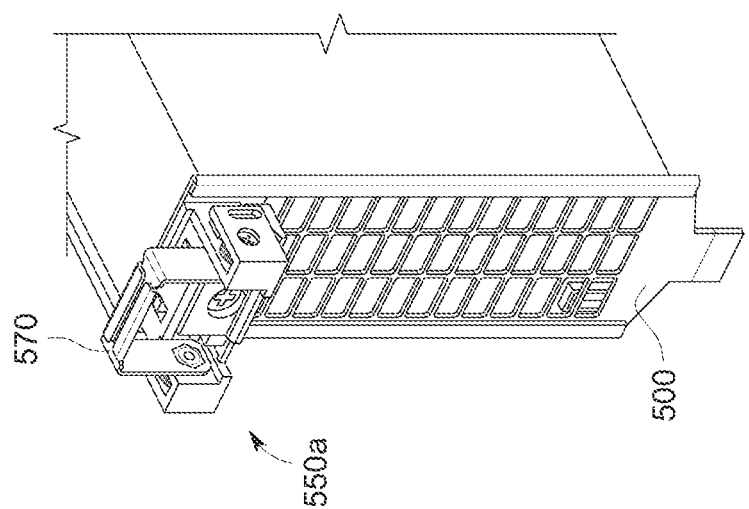

Turning now to FIGS. 5A and 5B, perspective views of an exemplary lever and slider mechanism for an IO bracket, such as a PCIe IO bracket, moving from a disengaged to an engaged position are illustrated. An exemplary IO bracket 500 is depicted that is disposed at one end of an add-in module. The IO bracket in FIG. 5A includes a lever and slider mechanism 550a with handle lever 570 in a first or upright position such that the add-in module can be removed from a computer device. The IO bracket 500 in FIG. 5B includes a lever and slider mechanism 550b with handle lever 570 rotated to a second or horizontal position such that the add-in module is locked or fixed to a mounting panel in the computer device. The operation of moving from the first position to the second position is now described referring to FIG. 5C, Which is a side view of the lever and slider mechanism 550b depicting an engaged position with the mounting panel 505 with the base depicted in hidden lines. The handle lever 570 is rotated in a counterclockwise direction R from a first position until it is in a second position, such as a horizontal position, causing the gear 590 to also rotate in a counterclockwise direction. The gear 590 is connected to the lever 570 as described, for example, in FIG. 2. The rotation of the gear 590 in the counterclockwise direction causes a gear bar 575 to move in an upward direction as a geared bar protrusion moves upwardly in slot 577 of the base 560. As the geared bar 575 moves in an upward direction, a spring 585 expands and pushes against or biases the wedge slider 565 away from bracket 500 towards an engagement opening 507, thereby causing the wedge slider 565 to engage with a mounting panel 505 and effectively be secured in the computer device.

Turning now to FIGS. 6A and 6B, perspective views of an exemplary lever and slider mechanism 550a and 550b for an IO bracket, such as a PCIe IO bracket, moving from an engaged to a disengaged position are illustrated. An exemplary IO bracket 500 is depicted that is disposed at one end of an add-in module. The IO bracket in FIG. 6A includes the lever and slider mechanism 550b with the lever 570 in the second or horizontal position such that the add-in module is locked or fixed in a computer device. The IO bracket in FIG. 6B includes a lever and slider mechanism 550a with handle lever 570 rotated to a first or upright position such that the add-in module can be removed from a computer device. The operation of moving from the second position to the first position is now described referring to FIG. 6C, which is a side view of the lever and slider mechanism 550a depicting the disengaged position with the base depicted in hidden lines. The lever 570 is rotated clockwise in direction R' from a second position until it is in a first position, such as an upright or vertical position, thereby causing the gear 590 to rotate in a clockwise direction. The gear 590 is connected to the lever 570 as described, for example, in FIG. 2. The rotation of the gear 590 in the clockwise direction causes the geared bar 575 to move in a downward direction with the geared bar protrusion moving downwardly in slot 577 of the base 560. As the geared bar 575 moves in the downward direction, the spring 585 now contracts or compresses as the wedge slider 565 moves toward bracket 500 and disengages from the engagement opening 507 of moving panel 505, thereby causing the wedge slider 565 to disengage from the mounting panel 505 and effectively being unsecured or in a released state within a computer device.

Figure 7A:
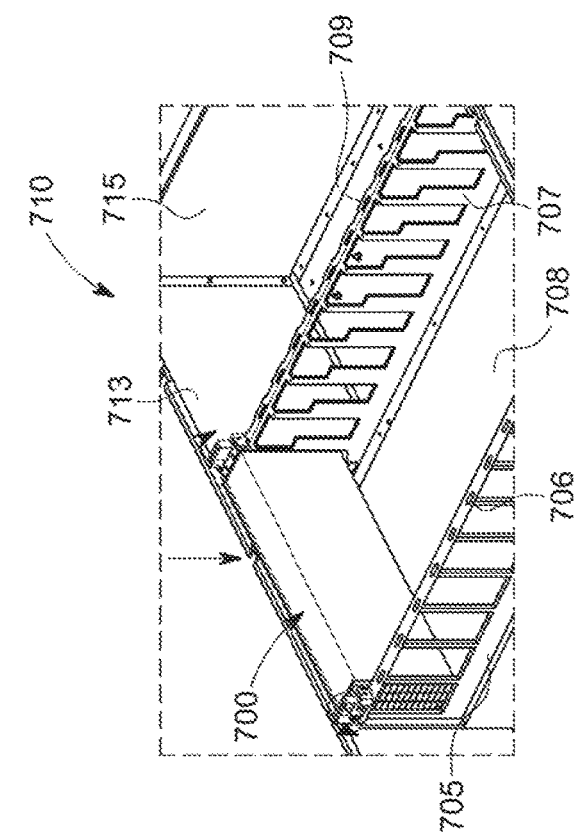
FIGS. 7A to 7C are perspective views of an add-in module with an IO bracket, including the lever and slider mechanism, disposed within an exemplary chassis of a computer device, according to some implementations of the present disclosure.
Figure 7B:
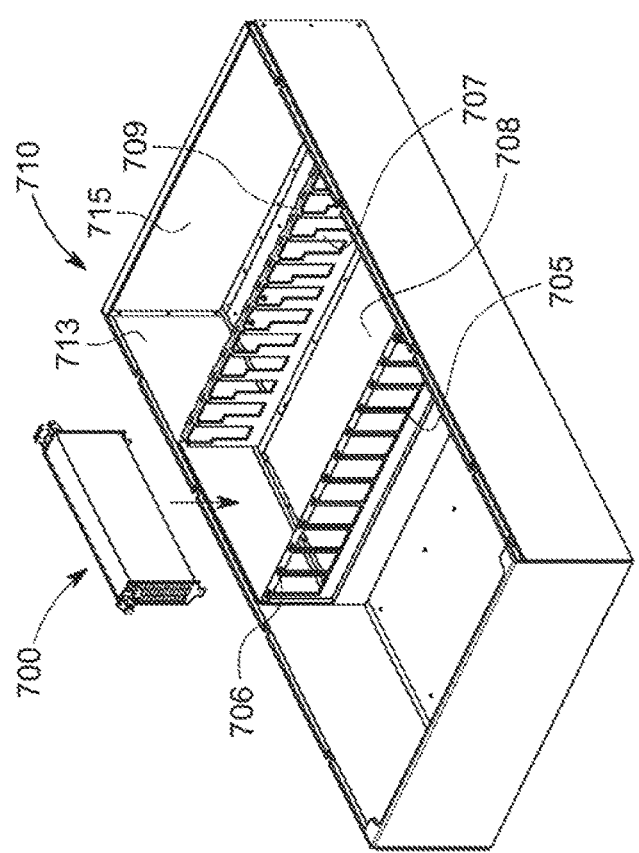
Figure 7C:
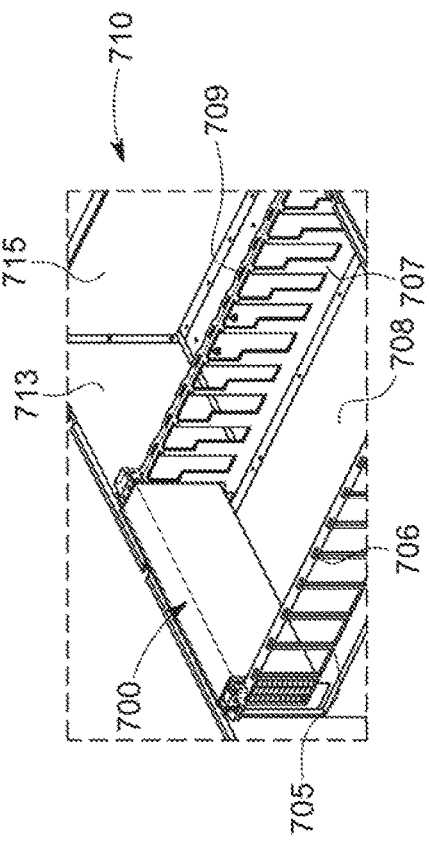

Turning now to FIG. 7A-7C, perspective views are depicted for disposing an add-in module with 10 bracket, including the lever and slider mechanism, 700 in an exemplary chassis 710 of a computer device that includes side walls 713 and a rear panel 715. In FIG. 7A, the add-in module with IO bracket 700 is depicted, just prior to disposal within the computer chassis, to align with mounting panels 705, 707. A horizontal base plate 708 is disposed between the mounting panels 705, 707. In FIG. 7B, the add-in module with IO bracket 700 is disposed between the two mounting panels 705, 707, but the lever and slider mechanism of add-in module 700, that is fixed to the 10 brackets, remains in a disengaged position. Next, in FIG. 7C, the lever and slider mechanisms on the IO brackets of the add-in module 700 are rotated causing the lever and slider mechanisms to engage with respective engagement openings 706, 709 in mounting panels 705, 707. In the depicted implementations, the mounting panels 705, 707 are secured to the computer chassis 710 using rivets, screws, or other fastening systems.

The illustrated aspects described above for FIGS. 2-7 are primarily in the context of PCIe add-in modules into a chassis of a computer device. However, the described lever and slider mechanism is applicable to other add-in modules for a computer device, including other types of brackets for securing and releasing a module to a mounting panel. The described lever and slider mechanism for engaging and disengaging from a mounting panel of a computer device is similarly contemplated as having been presented by way of example only, and not limitation, and can include different combinations of the described elements. For example, the base and wedge slider can have different configurations, including alternate ways for being secured to an IO bracket or to each other. Similarly, more or fewer gears and geared bars, along with different ways of coupling the handle lever to the wedge slider, are contemplated to accomplish the engaging and disengaging operations for the IO bracket to a mounting panel.

While various embodiments of the present invention have been described above, it should be understood that they have been presented by way of example only, and not limitation. Numerous changes to the disclosed embodiments can be made in accordance with the disclosure herein without departing from the spirit or scope. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations, and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. Furthermore, terms, such as those defined in commonly used dictionaries, should be interpreted as having a meaning that is consistent with their meaning in the context of the relevant art and will not be interpreted in an idealized or overly formal sense unless expressly so defined herein.

What is claimed is:

1. An apparatus for engaging a mounting panel of a computer device, the apparatus comprising:
   a bracket; and
   a lever and slider mechanism connected to the bracket, the lever and slider mechanism including:
   a base connected to the bracket,
   a wedge slider connected to the bracket and disposed immediately below the base, the wedge slider having a wedged end protrusion,
   a lever connected to the base and coupled to a gear, the lever rotatable from a first position to a second position and from the second position to the first position,
   a geared bar connected to the base and operably coupled to the gear, the geared bar having an angled end abutting and in substantial contact with the wedged end protrusion, and
   a biasing element disposed between the wedge slider and an outer surface of the bracket, the biasing element applying a force on the wedge slider in a direction away from the outer surface of the bracket,
   wherein rotating the lever from the first position to the second position causes the gear to engage the geared bar causing the geared bar to move vertically in a first direction, thereby allowing movement along the contact between the angled end of the geared bar and the wedged end protrusion of the wedge slider such that the biasing element pushes the wedge slider away from the bracket and allows the wedge slider to engage an opening in a mounting panel.

2. The apparatus of claim 1, wherein rotating the lever from the second position to the first position causes the gear to engage the geared bar causing the geared bar to move vertically in a second direction opposite the first direction, thereby allowing movement along the contact between the angled end of the geared bar and the wedged end protrusion of the wedge slider such that the wedge slider provides a counter force to the biasing element that moves the wedge slider closer to the bracket and allows the wedge slider to disengage from the opening in the mounting panel.

3. The apparatus of claim 1, wherein the bracket is an elongated bracket.

4. The apparatus of claim 1, wherein the bracket has a plurality of openings.

5. The apparatus of claim 1, wherein a step screw connects the wedge slider to the bracket.

6. The apparatus of claim 5, wherein the biasing element is a spring.

7. The apparatus of claim 6, wherein the step screw is partially inserted through a center of the spring such that the spring surrounds a length of the step screw.

8. The apparatus of claim 1, wherein the geared bar has a protrusion and the base includes at least one slot, the protrusion from the geared bar being disposed in the slot such that the slot defines a pathway of movement for the geared bar.

9. An add-in module for a computer device, the add-in module comprising:
   a housing having an outer shell defining at least two open opposing sides, the housing holding a plurality of peripheral components; and
   two input/output brackets each disposed over one of the opposing open sides, at least one of the two input/output brackets connected to a lever and slider mechanism, wherein the lever and slider mechanism includes:
   a base connected to the at least one of the two input/output brackets,
   a wedge slider connected to the at least one of the two input/output brackets and disposed immediately below the base, the wedge slider having a wedged end protrusion,
   a lever connected to the base and coupled to a gear, the lever rotatable from a first position to a second position and from the second position to the first position,
   a geared bar connected to the base and operably coupled to the gear, the geared bar having an angled end abutting and in substantial contact with the wedged end protrusion, and
   a spring disposed between the wedge slider and an outer surface of the input/output bracket, the spring biasing the wedge slider away from the outer surface of the input/output bracket,
   wherein rotating the lever from the first position to the second position causes the gear to engage the geared bar causing the geared bar to move vertically in a first direction, thereby allowing movement along the contact between the angled end of the geared bar and the wedged end protrusion of the wedge slider such that the spring expands biasing the wedge slider away from the bracket and allowing the wedge slider to engage an opening in a mounting panel.

10. The add-in module of claim 9, wherein rotating the lever from the second position to the first position causes the gear to engage the geared bar causing the geared bar to move vertically in in a second direction opposite the first direction, thereby allowing movement in along the contact between the angled end of the geared bar and the wedged end protrusion of the wedge slider such that the wedge slider provides a counter force compressing the spring and moving the wedge slider closer to the bracket to allow the wedge slider to disengage from the opening in the mounting panel.

11. The add-in module of claim 9, wherein the two input/output brackets each have a plurality of openings.

12. The add-in module of claim 9, wherein at least one of the two input/output brackets substantially covers one of the open sides.

13. The add-in module of claim 9, wherein the add-in module is a peripheral component interconnect express module.

14. The add-in module of claim 9, wherein the two input/input brackets are peripheral component interconnect express input/output brackets.

15. The add-in module of claim 9, wherein a step screw connects the wedge slider to the at least one input/output bracket.

16. The add-in module of claim 15, wherein the step screw is partially inserted through a center of the spring such that the spring surrounds a length of the step screw.

17. The add-in module of claim 9, wherein the geared bar has a protrusion and the base includes at least one slot, the protrusion from the geared bar being disposed in the slot such that the slot defines a pathway of movement for the geared bar.

* * * * *